United States Patent
Rey-Losada (10) Patent No.: US 8,363,502 B2
(45) Date of Patent: Jan. 29, 2013

(54) SYSTEM AND METHOD FOR CORRECTING PROGRAMMING FAILURES IN A PROGRAMMABLE FUSE ARRAY

(75) Inventor: Daniel Rey-Losada, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 189 days.

(21) Appl. No.: 12/950,780

(22) Filed: Nov. 19, 2010

(65) Prior Publication Data

US 2012/0131400 A1   May 24, 2012

(51) Int. Cl.
  *G11C 17/18* (2006.01)
(52) U.S. Cl. ............... 365/225.7; 365/200; 365/201; 365/185.09
(58) Field of Classification Search ............ 365/225.7, 365/200, 201, 185.09
See application file for complete search history.

(56) References Cited

U.S. PATENT DOCUMENTS

| 7,030,641 | B1 | 4/2006 | Tang et al. | 324/765 |
| 2006/0245283 | A1* | 11/2006 | Vogelsang | 365/205 |
| 2007/0226400 | A1 | 9/2007 | Tsukazaki | |
| 2008/0104472 | A1 | 5/2008 | Tang | |

* cited by examiner

*Primary Examiner* — Jason Lappas
(74) *Attorney, Agent, or Firm* — Koppel, Patrick, Heybl & Philpott (57) ABSTRACT

A system for correcting programming failures in an M-bit primary array of programmable fuses. The address of the failed fuse is stored in a secondary fuse array. Correction logic coupled to the primary and secondary arrays propagates the programming states of the good fuses, and corrects the programming state of the failed fuse, if any. The correction logic preferably comprises a decoder coupled to the secondary array which produces a one-hot M-bit word representing the failed fuse, and combinatorial logic arranged to receive the programming states of the primary array fuses and the one-hot M-bit word at respective inputs and to produce the correction logic output. Multiple failures can be accommodated using multiple secondary arrays, each storing the address of a respective failed fuse, or a tertiary array which stores the address of a failed fuse in either the primary or secondary arrays.

23 Claims, 4 Drawing Sheets

SYSTEM AND METHOD FOR CORRECTING PROGRAMMING FAILURES IN A PROGRAMMABLE FUSE ARRAY

BACKGROUND OF THE INVENTION

1. Field of the Invention

This invention relates generally to programmable fuse arrays, and particularly to schemes for correcting programming failures in such arrays.

2. Description of the Related Art

Memory devices are increasingly used in analog circuits to configure their behavior. Such circuits are arranged such that one or more of their operating parameters can be set via the application of a digital input word, the bits of which are stored in the memory device. Examples include setting the gain and/or offset of an amplifier, setting the cut-off frequency of a filter, calibrating an analog-to-digital converter (ADC) or digital-to-analog converter (DAC), or defining an input-to-output characteristic for a non-linear amplifier.

One common type of non-volatile memory device is a programmable fuse; a blown fuse represents, for example, a logic '1', and an intact or unblown fuse represents a logic '0'. Such fuses are typically provided in an array, and arranged to be individually programmed by means of a programming procedure that typically requires that a specified programming current be passed through any fuse that is to be blown; no programming current is passed through a fuse that is to remain intact. A means is typically provided to determine whether the fuses in an array have been successfully programmed. A 'programming failure' occurs when the programming procedure required to blow a particular fuse was executed, but was unsuccessful.

A number of schemes have been developed for correcting a programming failure of this sort. For example, U.S. Patent Application Publication 2008/0104472 to Tang describes a scheme that can be used to correct fuse-programming failures, in which a predetermined algorithm is used to compute a set of redundancy bits from the data bits to be stored. The calculated redundancy bits and the data bits are programmed into fuses. When the data and redundancy bits are read back, the algorithm is applied to the read-back data to calculate a new set of redundancy bits, which are compared to the read-back set of redundancy bits. If the sets differ, a programming failure is assumed and correction is attempted.

This scheme has two primary drawbacks. First, since redundancy bits are calculated for all data bits, programming time is increased on all parts, regardless of whether they exhibit a programming failure. Second, the scheme does not allow programming of additional fuses after the calculated redundancy bits have been programmed.

U.S. Patent Application Publication US 2007/0226400 to Tsukazaki describes a method by which significant corrections to the contents of a one-time-programmable memory can be made. The method requires the storage of the data needed to modify the contents of the memory, as well as the storage of data identifying the area of the memory to be modified.

SUMMARY OF THE INVENTION

A system and method for correcting programming failures in a programmable fuse array are presented which avoid the problems noted above, with minimal overhead in terms of area, power, access time and design effort.

The present system corrects programming failures in a primary array of programmable fuses. The system includes a secondary array of programmable fuses in which an address identifying the fuse in the primary array that failed a programming attempt (referred to herein as a 'failed fuse') can be stored, and correction logic which is coupled to both primary and secondary arrays. The correction logic is arranged to propagate the programming states of the fuses in the primary array which were programmed with no failures to an output, correct the programming state of the failed fuse, if any, and to propagate the corrected programming state to the output.

The system's correction logic preferably includes a decoder coupled to the secondary array and arranged to decode the programming states of the fuses of the secondary array to produce a one-hot M-bit word (where M is the number of fuses in the primary array) representing which of the fuses of the primary array, if any, failed a programming attempt. The correction logic preferably also includes combinatorial logic arranged to receive the programming states of the fuses in the primary array and the bits of the one-hot M-bit word at respective inputs, and to produce the correction logic output.

In one embodiment, the system comprises a plurality of secondary arrays, each of which is sized to be capable of storing the address of a respective programmable fuse in the primary array which failed a programming attempt (or an address which does not correspond to any fuse in the primary array if there were no failed fuses). The correction logic is then coupled to the primary array and each of the secondary arrays, and arranged to correct the programming states of the fuses which failed a programming attempt located at the addresses stored in any of the secondary arrays.

Another possible embodiment employs both secondary and tertiary fuse arrays, with the system arranged to store the address of a first failed fuse in the secondary array, and the address of a second failed fuse—which could be in either the primary or secondary arrays—in the tertiary array. The correction logic is coupled to the primary, secondary and tertiary arrays, and arranged to correct the programming states of both the first and second failed fuses.

These and other features, aspects, and advantages of the present invention will become better understood with reference to the following drawings, description, and claims.

DETAILED DESCRIPTION OF THE INVENTION

Figure 1:
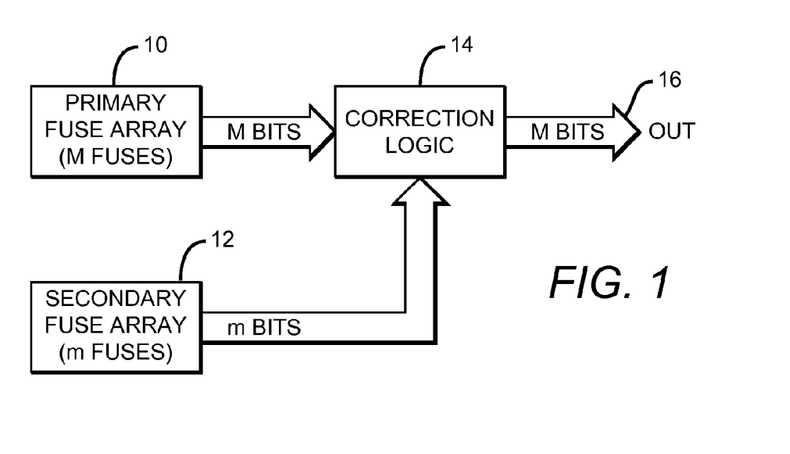
FIG. 1 is a block diagram of one possible embodiment of a system for correcting programming failures in a programmable fuse array per the present invention.

One basic embodiment of a system which corrects programming failures in an array of programmable fuses is illustrated in FIG. 1. The system includes a primary array 10 of programmable fuses, a secondary array 12 of programmable fuses, and correction logic 14.

When the programming of one of the fuses in the primary array 10 is determined to have failed (a 'failed fuse'), an address used to identify that fuse is programmed into the secondary fuse array. If no programming failures occur, the secondary fuse array is left unprogrammed or programmed to an address that does not correspond to any fuse in the primary array.

Correction logic 14 is coupled to primary array 10 and secondary array 12, and arranged to:
propagate the programming states of the fuses in the primary array which were programmed with no failures to an output 16,
correct the programming state of the failed fuse; and
propagate the corrected programming state to output 16.

The present system would typically be arranged such that the states of all the fuses in the primary array are provided to the correction logic simultaneously and in parallel, though this is not essential.

To provide single-bit correction, the secondary array must be sized so that it can hold an address identifying the failed fuse or some address corresponding to no fuse in the array to signify that no correction is necessary. Given a primary array of M programmable fuses, correction of up to a single fuse-programming failure can be implemented using a secondary array of m fuses to store the address of the failed fuse, if any, with $m \geq ceil(Log_2(M+1))$. For example, assume a primary array containing 1024 programmable fuses (M=1024). Since $ceil(Log_2(1025))=10.0014$, to provide single-bit correction, the number of fuses in the secondary array must be greater than or equal to 11.

In the examples described herein, an intact fuse represents a logic '0' and a blown fuse represents a logic '1'. A 'programming failure' occurs when an attempt has been made to blow one of the programmable fuses, but the attempt fails such that the fuse indicates the wrong logic level. Since an intact fuse requires no programming, a programming failure can only occur when attempting to blow a fuse; thus, in these examples, a fuse which has suffered a programming failure will indicate a '0' when it should instead indicate a '1'. Note, however, that the present system and method is equally applicable to a system in which an intact fuse represents a '0' and a blown fuse represents a '1', or to a system in which an intact fuse represents a '1' and a blown fuse represents a '0'.

Figure 2:
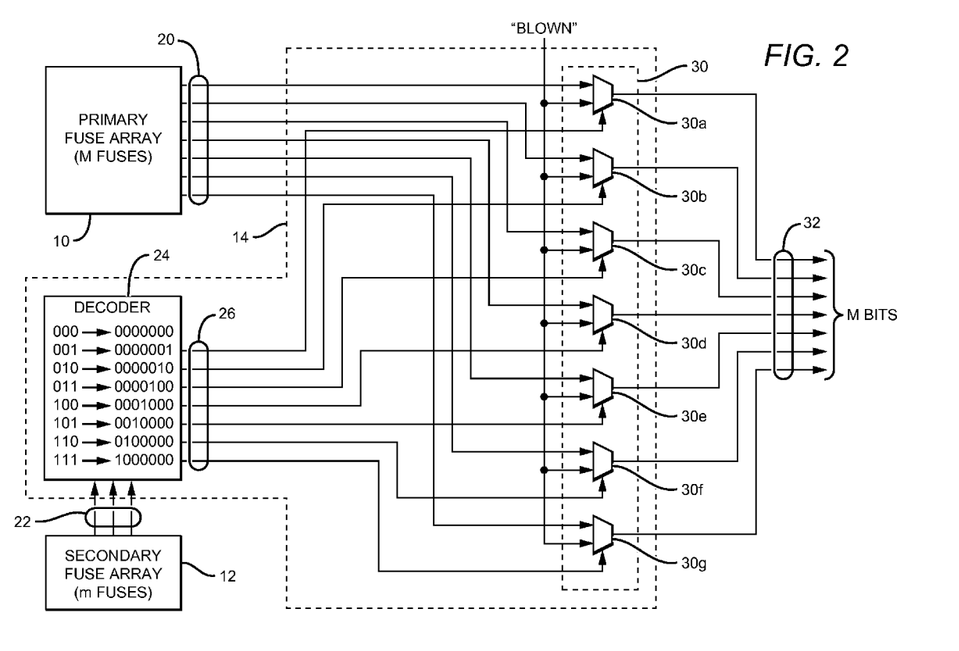
FIG. 2 is a block/schematic diagram of one possible embodiment of a system for correcting programming failures in a programmable fuse array per the present invention.

Correction logic 14 suitably includes a decoder coupled to the secondary array and arranged to decode the programming states of the fuses of the secondary array to produce a one-hot M-bit word representing which of the fuses of the primary array, if any, failed a programming attempt. Correction logic 14 also suitably includes combinatorial logic—suitably an array of M simple combinatorial circuits—arranged to receive the programming states of the primary array fuses and the bits of the one-hot M-bit word at respective inputs and to produce the correction logic output. One possible embodiment is shown in FIG. 2. In this example, primary array 10 has 7 programmable fuses, each of which has its own signal line 20 which is either at a logic '1' or '0' depending on the state of the corresponding fuse. With M=7, the number of fuses (m) in secondary array must be at least 3, each of which has a corresponding respective signal line 22 as shown in FIG. 2. If it is determined that one of the fuses in primary array 10 experienced a programming failure, its address is stored by blowing the appropriate fuses within secondary array 14.

A one-hot M-bit word decoder 24 receives the three signal lines 22 from secondary array 12 at its inputs, and has seven bit lines 26 as its outputs. The address indicated on the incoming signal lines determines which of the seven bit lines is to be set to '1', if any; one possible correspondence between the incoming address and the states of bit lines 26 is shown in FIG. 2.

The signal lines 20 from the primary fuse array and the bit lines 26 from the decoder are provided to combinatorial logic 30, here consisting of M combinatorial logic elements 30a-30g (represented as multiplexers in FIG. 2), each of which has two inputs, a control input, and an output. In this illustration, each of signal lines 20 is provided to the first input of a respective one of elements 30a-30g, a logic level representing the 'blown' state is provided to the second input of each element, and each of bit lines 26 from the decoder are connected to a respective control input.

In operation, when the bit line connected to a combinatorial logic element's control input is a '0', indicating that the corresponding fuse in the primary array was programmed successfully, the value of that fuse's signal line is propagated to the element's output. However, when a combinatorial logic element's bit line is a '1', indicating that the corresponding fuse in the primary array experienced a programming failure—i.e., the fuse shown have been blown but reads as 'intact'—the logic level representing the 'blown' state is propagated to the element's output, thus effectively correcting the programming state of the failed fuse. The M output lines 32 thus represent the desired state of each of the fuses in the primary array. Note that correction logic 14 may be implemented as part of the circuitry associated with primary array 10, or be external to the primary array.

Though the use of a one-hot decoder is described above, this is not essential. Alternative decoding schemes might also be used.

Note that it is not essential that the primary array have any special attributes related to addresses. The present system, in its simplest form, uses a secondary array to store information that allows the correction logic to identify the fuse that failed programming. This identification is typically accomplished by storing in the secondary array the address of the fuse in the primary array that failed programming. However, the address need not be something intrinsic to the primary array; it is just a convention used in the decoding logic to identify the fuse needing correction. Thus, as used herein, the 'address' of a failed fuse can be any information capable of identifying the fuse needing correction which is also capable of being stored in the fuses of a secondary array.

Figure 3:
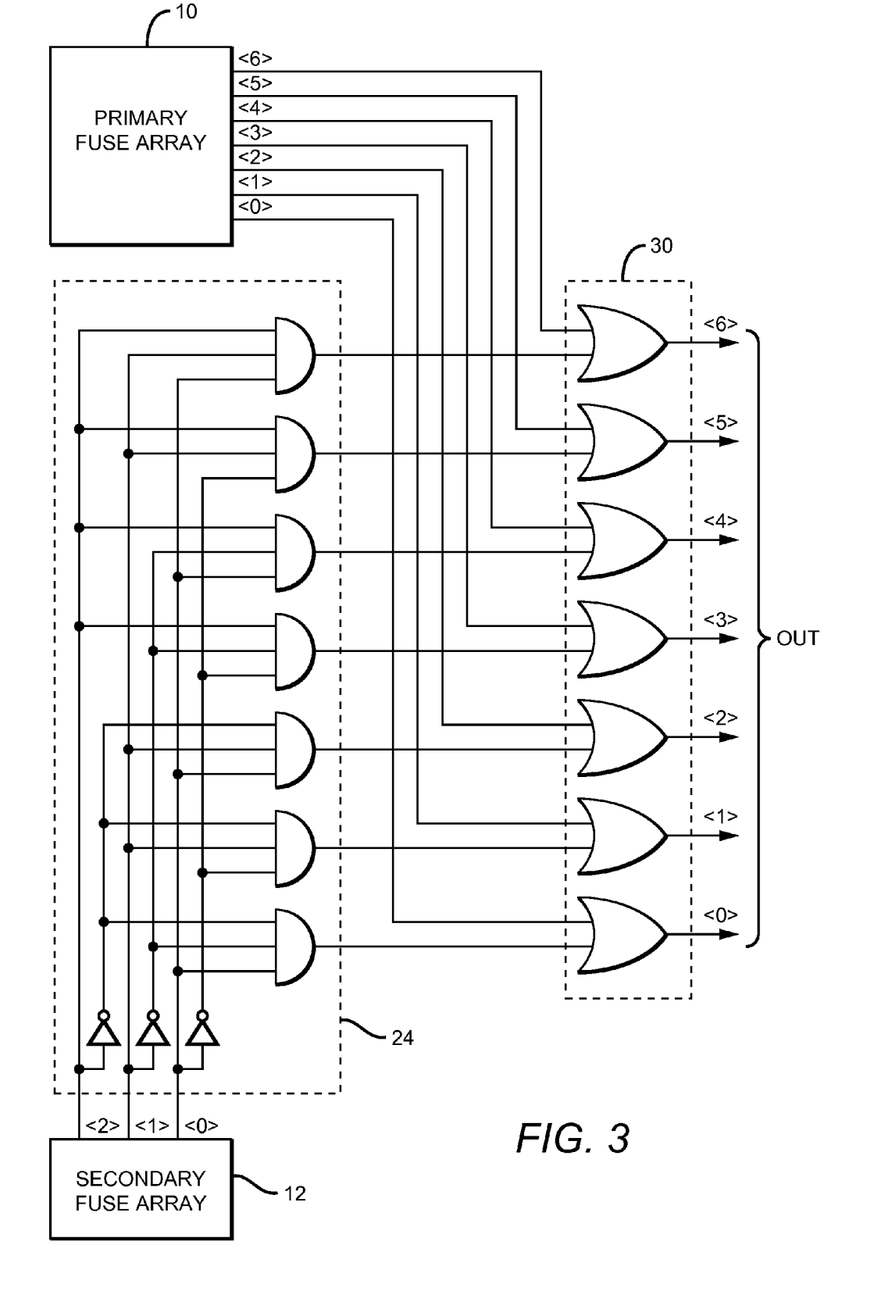
FIG. 3 is a block/schematic diagram of the system shown in FIG. 2, showing the details of one possible implementation.

In practice, the combinatorial logic elements can be reduced to a single logic gate each; one possible implementation is shown in FIG. 3. As above, this exemplary implementation assumes that a 'blown' fuse represents a logic '1', primary array 10 and secondary array 12 have seven and three programmable fuses, respectively, and the correction logic includes decoder 24 and combinatorial logic 30. Here, combinatorial logic 30 is made from seven 2-input OR gates. The arrangement of inverters and AND gates in decoder 24 implements the one-hot M-bit word decoder illustrated in FIG. 2.

The address of a failed fuse stored in secondary array 12 drives decoder 24, which outputs M bit lines to combinatorial logic 30, with each bit line corresponding to the address of one of the primary array fuses. Thus, when one of the bit lines is a '1', this indicates that the corresponding fuse in the primary array experienced a programming failure; this '1' is then propagated to the output via the OR gate to which the bit line is connected, thus effectively correcting the programming state of the failed fuse.

The present system offers a number of advantages over prior art approaches. For example, the size of the secondary array necessary for correction is smaller than that needed by other approaches, because it only requires enough fuses to store the location(s) of the failed fuse—i.e., no corrected data needs to be stored. Also, the time required to program the primary array is only increased for the small fraction of parts that exhibit a programming failure.

The present system is also backwards compatible with fuse programming systems which do not incorporate the present error correction method, because the product can still be programmed in a manufacturing flow that does not incorporate the scheme described herein. Therefore, a product can be updated to incorporate the present error correction scheme without necessitating that changes be made by customers in those cases in which they program the fuses. Additionally, the IC provider can decide to make only a fraction of the customers aware of the fuse-programming correction method.

It should also be noted that the contents of the secondary array are determined by the programming failures—not by the data written to the primary array. Therefore, programming need not happen all at once; additional fuses in the primary array can be programmed well after the array was first programmed. Also, the secondary array can use fuses of the same type as those used in the primary array, thereby providing a correction scheme that can be monolithically integrated with the primary array and that requires no design of any special correction-memory cells. In addition, the described system requires only moderate overhead in terms of the logic and number of additional fuses necessary.

When a first attempt to program a fuse fails, it is typically impossible to program that fuse by attempting programming again. This may be because some of the circuitry associated with the fuse to be blown is permanently damaged, or because the first attempt at blowing the fuse changed its physical characteristics in a way that will make further attempts unsuccessful (for example, the failed attempt can increase the fuse's resistance which will make future blowing impossible). For this reason, a method for correcting fuse programming failures as described herein is particularly useful.

Though the system has been described as being capable of correcting a single-bit programming error, it can also be adapted to provide correction for multiple programming errors, as is discussed below. However, even when the described invention is used to provide correction of only a single-bit programming error, it greatly reduces the probability of an unrecoverable programming error, particularly for arrays of moderate to small size and when the probability of a programming error for an individual fuse is small. As an example, assume that all fuses must be programmed and a primary array of size M=1023 bits, in which the probability of erroneous programming of each individual bit is 10 ppm. In this case, the present system reduces the probability of an unrecoverable programming error from ~1% to 53 ppm—an improvement by a factor of almost 200. As a second example, assume a primary array of size M=7 bits with a probability of erroneous programming of each individual bit of 1 ppm. Here, the present system reduces the probability of an unrecoverable programming error from $7^{-6}$ to $45^{-12}$—an improvement by a factor over 150,000. In general, for a primary array of size M and an individual-bit programming-error probability of p, the probability of an unrecoverable programming error when the present system is not used is computed (conservatively assuming that all fuses must be programmed) as:

$$p(\text{unrecoverable})=1-(1-p)M.$$

When the present system is used with a secondary array of size m, the probability of an unrecoverable programming error is computed (conservatively assuming that all fuses must be programmed) as:

$$p(\text{unrecoverable})=1-(1-p)(M+m)-(M+m)*p*(1-p)(M+m-1).$$

The examples shown in FIGS. 1-3 assumed a primary fuse array with an output port of the same width as the size of the array, thereby making the state of all the fuses available simultaneously. However, for large fuse arrays, it becomes prohibitively area-consuming to make the contents of all the cells available simultaneously. In these cases, a common approach is to use an "addressable fuse array", in which an address port receives the address of a subset of data (referred to herein as a "word") to be made available on an output port having a width smaller than the total size of the array. For example, a primary array could have 8192 fuses, with a 10-bit address port that selects one of 1024 8-bit words to be made available on an 8-bit output data port.

Figure 4:
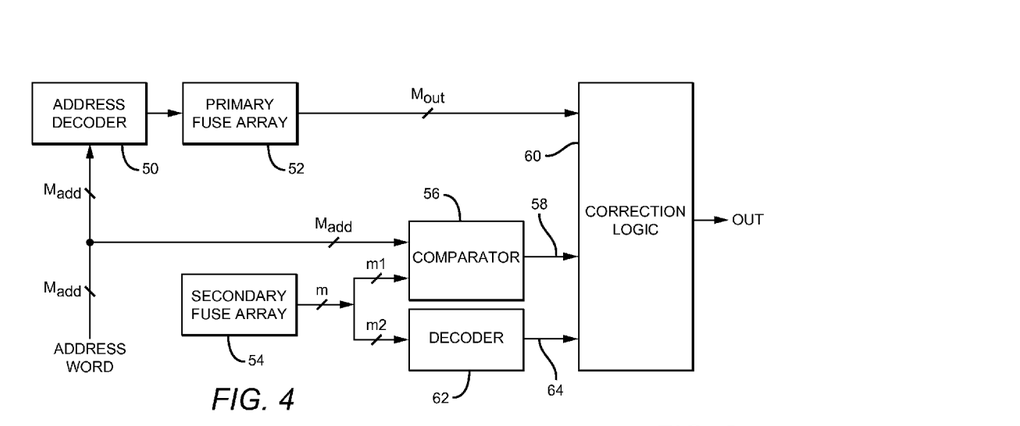
FIG. 4 is a block diagram of one possible embodiment of a system per the present invention which enables the correction of programming failures in an addressable programmable fuse array.

An example of a system which includes an addressable primary fuse array is shown in FIG. 4. An address word having $M_{add}$ bits is applied to an address decoder 50, which in turn selects an $M_{out}$-bit word to be output by a primary fuse array 52; due to a programming failure, this output word may contain a programming error.

A secondary array 54 stores an m-bit identifier for the fuse that failed programming To identify the specific bit in the primary array that failed, the m-bit identifier must identify the word in the primary array which contains the failed bit, as well as the specific bit within the word. Thus, m1 bits of this m-bit identifier are used to represent the address of the word in the primary array, and m2 bits of the m-bit identifier are used to specify the specific bit within the word that failed programming (m1+m2=m).

A comparator 56 is used to determine whether a programming failure occurred for one of the fuses within the word currently being selected for output from primary array 52. This may be accomplished by providing the m1 portion of the identifier stored in secondary array 54 to a first input of the comparator, and the $M_{add}$ bits of the address word to a second input. These inputs are then compared to determine if a failure occurred within the word currently being selected. The comparator provides a signal 58 to correction logic 60 to indicate whether or not a correction must occur. A one-hot decoder 62 receives the m2 bits of the m-bit identifier, and produces a signal 64 that will be used by correction logic 60 to correct the particular bit within the output word that failed programming.

Typically, all of the words stored in an addressable fuse array have the same width. Note, however, that the present system can also be implemented to correct programming failures in an addressable fuse array having words of different widths.

Figure 5:
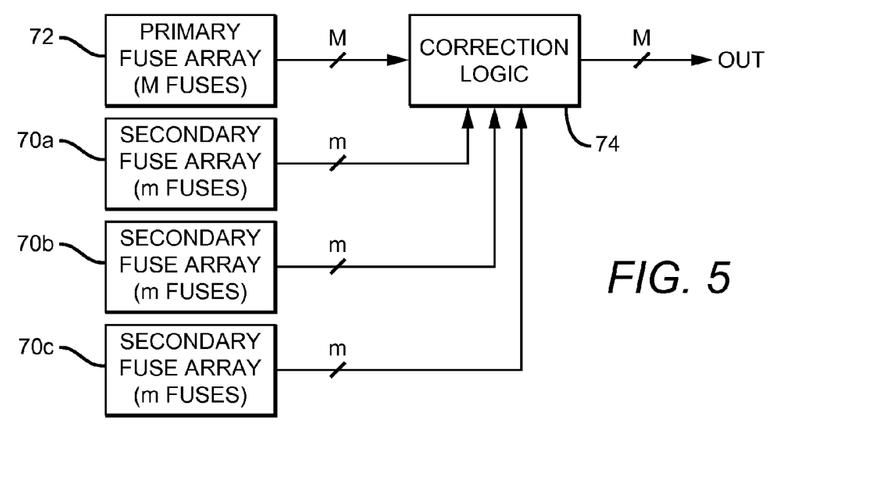
FIG. 5 is a block diagram of one possible embodiment of a system per the present invention which enables the correction of multiple programming failures.

As noted above, the present system may be adapted to provide correction for multiple programming errors. One possible way of accomplishing this is shown in FIG. 5. Here, a plurality of secondary arrays are provided—three such arrays 70a, 70b, 70c are illustrated in FIG. 5—each of which is sized to be capable of storing the address of a respective failed fuse in primary array 72 (or an address which does not correspond to any fuse in the primary array if there were no failed fuses). The correction logic 74 would then be coupled to the primary array and each of the secondary arrays and arranged to:

propagate the programming states of the fuses in the primary array which were programmed with no failures to an output, correct the programming states of the failed fuses (if any) located at the addresses stored in the secondary arrays; and propagate the corrected programming states to the output. To accommodate multiple programming errors, the correction logic would need to include dedicated one-hot decoders for each of the secondary arrays. In addition, assuming the combinatorial logic elements were OR gates as shown in FIG. 3, each OR gate would require a number of inputs equal to the number of secondary arrays, so that a bit in the primary array can be corrected when a '1' from any of the one-hot decoders is present at the OR gate inputs for that particular bit.

Though this technique of using multiple secondary arrays as shown in FIG. 5 can correct multiple programming failures in the primary array, it does not correct for any errors in the secondary array. For this reason, the approach explained next is preferred to allow correction of multiple programming failures.

Figure 6:
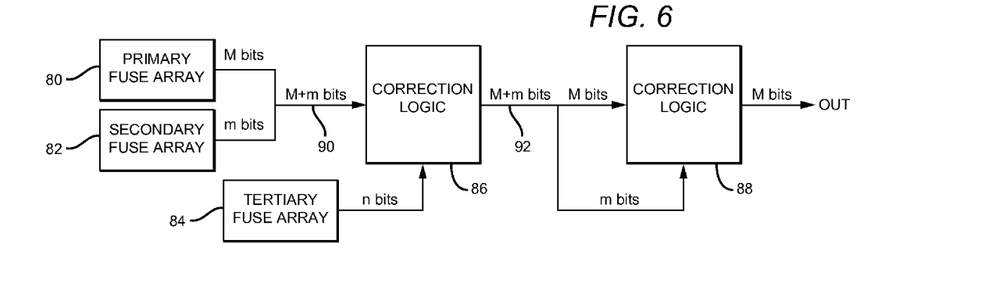
FIG. 6 is a block diagram of another possible embodiment of a system per the present invention which enables the correction of multiple programming failures.

Two programming failures can be corrected—regardless of whether they occur in the primary array or in the secondary array—by applying the method described above twice, with the one of the applications of the method being performed on an array which is a combination of the primary and secondary arrays. One possible embodiment of such a system is illustrated in FIG. 6, which includes an M-bit primary array 80, an m-bit secondary array 82, an n-bit tertiary array 84, and two correction logic blocks 86 and 88. Operation for the cases of no programming error, one programming error, and two programming errors is as follows:

If no programming error occurs during the programming of primary array 80, the secondary and tertiary fuse arrays are left unprogrammed or programmed to an address that does not correspond to any fuse in the primary array. The M bits from primary array 80 are propagated to the output through correction blocks 86 and 88 without correction.

If the programming of primary array 80 results in a programming failure, the address of the failed fuse is stored in secondary array 82. If no other failures occur while programming the primary array, tertiary array 84 is left unprogrammed (or programmed to an address that does not correspond to any fuse in the primary array) and the combination 90 of M+m bits—corresponding to the actual contents of the primary and secondary arrays—propagate uncorrected through correction logic block 86. Correction logic block 88 then receives the uncorrected M bits from the primary array and will correct them in accordance with the m bits from the secondary array to produce an M-bit output with the one programming failure corrected.

If a second programming failure occurs—either while programming the primary array or during the process of storing the address of the failed fuse in the secondary array—the tertiary array is used to store the address of the fuse of combination array 90 which suffered the second programming failure. Correction of this second programming failure is performed by correction logic block 86 in accordance with the n bits provided by tertiary array 84, such that the output 92 of correction logic block 86 is delivered to correction logic block 88 with the second (but not the first) programming failure corrected. The first programming failure will then be corrected by correction logic block 88, making use of the m bits that were stored in the secondary array.

This idea can be recursively applied an arbitrary number of times to allow for the correction of an arbitrary number of programming failures.

Though this method is described such that—for the case of a single fuse-programming failure in the primary array—the address for that failed fuse is stored in the secondary array, this is not essential. The present system could easily be adapted such that the first failed fuse in the primary array is stored in the tertiary array. Similarly, if two programming failures occur and they both happen to occur in the primary array (rather than one in the primary array and the other one in the secondary array), the present system could be arranged to store the address corresponding to the first programming failure in the tertiary array and to store the address for the second programming failure in the secondary array.

Note that, in addition to using the present system with addressable arrays (as illustrated in FIG. 4), and applying the correction method with a plurality of secondary arrays or recursively so that two or more programming failures can be corrected (as illustrated in FIGS. 5 and 6), it could also be applied to a combination of these two embodiments, so as to provide correction of two or more programming failures in addressable arrays.

The present system would typically be implemented such that data is conveyed between the arrays and the correction logic in parallel. It should be noted that the interfaces between the arrays and the correction logic could alternatively be implemented to transport the data serially. Similarly, though the correction logic would typically be combinational, it might alternatively be implemented as sequential correction logic that sequentially processes one or more bits a time to determine if correction is necessary, and to perform the correction when necessary Proper operation of the present system requires that a means be provided to detect the occurrence of a programming failure in the primary array and the identifier for the failed fuse, so that the proper identifier can be stored in the secondary array. Similarly, a system as shown in FIG. 6 would require that a means be provided to detect the occurrence of a programming failure in the combination array 90 and the identifier for the failed fuse, so that the proper identifier can be stored in the tertiary array. Note that it is a simple matter to detect the occurrence of a programming failure; this can be accomplished by, for example, reading back the state of a fuse immediately after it is programmed (using, for example, the same read method that will be used to access the contents of the fuse array during normal operation).

The present scheme can be extended to operate with primary array fuses that can be programmed to any of three or more states. However, since the present system implements correction without storing the value that should have been on the failed fuse, it is required that—when correcting errors in a fuse array of this type—the value that was intended to be programmed into the failed fuse can be inferred from the value that was actually programmed. One example of this would be a fuse array whose cells could have one of three states (e.g., 'intact', 'half-blown', and 'fully-blown'), which would have the characteristic than when a programming failure occurs it would commonly be because of "reduced strength" in the programming process, such that if a programming failure resulted in a fuse being half-blown, it would commonly read as an 'unblown', and if a programming failure resulted in a fuse being fully-blown, it would commonly read as a 'half-blown'. When so arranged, it is only necessary that the address of the failed fuse be stored in the secondary array. This information, along with knowing the state of the failed fuse, enables the present system to correct the contents of the failed fuse cell.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A system for correcting programming failures in a primary array of programmable fuses, comprising:
   a secondary array of programmable fuses, said system arranged to store an address identifying a fuse in the primary array which failed a programming attempt in said secondary array; and
   correction logic coupled to said primary and secondary arrays and arranged to:
      propagate the programming states of the fuses in said primary array which were programmed with no failures to an output,
      correct the programming state of the fuse which failed a programming attempt located at the address stored in said secondary array, if any; and
      propagate said corrected programming state to said output.

2. The system of claim 1, wherein said secondary array is sized to be capable of storing the address of one primary array fuse, or an address which does not correspond to any fuse in the primary array if there were no failed fuses.

3. The system of claim 1, wherein said primary array contains M programmable fuses and said secondary array contains m programmable fuses, where $m \geq \text{ceil}(\log_2(M+1))$.

4. The system of claim 1, wherein said correction logic comprises:
   a decoder coupled to said secondary array and arranged to decode the programming states of the fuses of said secondary array to produce a one-hot M-bit word representing which of the fuses of said primary array, if any, failed a programming attempt; and
   logic arranged to receive the programming states of the fuses in said primary array and the bits of said one-hot M-bit word at respective inputs and to produce said correction logic output.

5. The system of claim 4, wherein said logic comprises an array of M 2-input OR gates.

6. The system of claim 1, wherein said correction logic comprises sequential logic arranged to arranged to receive the programming states of the fuses in said primary array serially.

7. The system of claim 1, wherein said correction logic is external to said primary array.

8. The system of claim 1, further comprising a means for detecting that a programmable fuse in said primary array has failed a programming attempt.

9. The system of claim 1, wherein said system comprises a plurality of said secondary arrays, each of which is arranged to store an address identifying a fuse in a respective primary array which failed a programming attempt, said correction logic coupled to said primary array and each of said secondary arrays and arranged to:
   propagate the programming states of the fuses in said primary array which were programmed with no failures to an output,
   correct the programming states of the fuses which failed a programming attempt located at the addresses stored in said secondary arrays, if any; and
   propagate said corrected programming states to said output.

10. The system of claim 1, further comprising a tertiary array of programmable fuses, said system arranged to store an address identifying a fuse in the primary array or in the secondary array which failed a programming attempt in said tertiary array, said correction logic further coupled to said tertiary array and arranged to:
    propagate the programming states of the fuses in said primary array which were programmed with no failures to an output,
    correct the programming state of the fuse which failed a programming attempt located at the address stored in said secondary array, if any; and
    correct the programming state of the fuse which failed a programming attempt located at the address stored in said tertiary array, if any.

11. The system of claim 10, wherein said correction logic comprises a first correction logic block connected to receive the bits of said primary and secondary arrays and to correct them in accordance with the bits stored in said tertiary array, if any, and a second correction logic block connected to receive the output of said first correction logic block, said system arranged such that:
    if no programming error occurs during the programming of said primary array, no addresses are stored in said secondary and tertiary fuse arrays or the addresses stored correspond to no fuses in said secondary and tertiary fuse arrays, and the bits of said primary array propagate through said first and second correction logic blocks without correction;
    if programming of said primary array results in a programming failure, the address of the failed fuse is stored in said secondary array, and if no other failures occur while programming the primary array:
       no addresses are stored in said tertiary array or the address stored in said tertiary array corresponds to no fuse in the primary or secondary arrays;
    the bits of said primary and secondary arrays propagate uncorrected through said first correction logic block; and
    said second correction logic block receives the bits of said primary and secondary arrays propagated by said first correction logic block and corrects the bit associated with said programming failure in accordance with the bits from said secondary array; and
    if a second programming failure occurs, either while programming said primary array or storing the address of a failed primary array fuse in said secondary array:
       the address of said second failed fuse is stored in said tertiary array;
       said first correction logic propagates the bits of said primary and secondary arrays and corrects the bit associated with said second programming failure in accordance with the bits from said tertiary array; and
       said second correction logic block receives the bits of said primary and secondary arrays propagated by said first correction logic block and corrects the bit associated with said first programming failure in accordance with the bits from said secondary array.

12. The system of claim 10, wherein said primary array is an addressable array.

13. The system of claim 1, wherein each of said fuses in said primary array can be programmed to any of three or more states.

14. The system of claim 13, said system arranged such that the value that was intended to be programmed into a programmable fuse in said primary array that has failed a programming attempt can be inferred from the value that was actually programmed.

15. The system of claim 1, wherein the states of the fuses in said primary array are provided to said correction logic simultaneously and in parallel.

16. The system of claim 1, wherein the states of the fuses in said primary array are provided to said correction logic serially.

17. The system of claim 1, wherein said primary array is an addressable array.

18. The system of claim 1, wherein said primary array is an addressable array of words each having $M_{out}$ bits and said secondary array is arranged to store an identifier having m1 bits to identify the word, if any, in the primary array which contains a failed bit, and m2 bits to identify the specific bit within said word, said system further comprising:
- an address decoder which receives an address and selects the corresponding $M_{out}$-bit word to be output by said primary fuse array; and
- a comparator which compares the address of the word currently being selected with the m1 portion of said identifier to determine if a failure occurred within the word currently being selected, wherein said correction logic comprises:
  - a decoder arranged to receive and decode the m2 portion of said identifier to produce a one-hot M-bit word representing the failed bit of the word, if any, which contains the failed bit; and
  - combinatorial logic arranged to receive the programming states of the fuses in said primary array, the output of said comparator, and the bits of said one-hot M-bit word at respective inputs, and to produce said correction logic output.

19. A method of correcting programming failures in a primary array of programmable fuses, each of which has a corresponding address, comprising:
- storing an address identifying a fuse in the primary array which failed a programming attempt;
- propagating the programming states of the fuses in said primary array which were programmed with no failures to an output,
- correcting the programming state of the fuse which failed a programming attempt located at the stored address, if any, and
- propagating said corrected programming state, if any, to said output.

20. The method of claim 19, further comprising:
- detecting that a programmable fuse in said primary array has failed a programming attempt.

21. The method of claim 19, wherein said step of correcting the programming state of the fuse which failed a programming attempt comprises:
- decoding the stored address to produce a one-hot M-bit word representing which of the fuses of said primary array, if any, failed a programming attempt; and
- using said one-hot M-bit word to correct the programming state of the fuse which failed a programming attempt.

22. The method of claim 19, wherein the address of a programmable fuse in said primary array which failed a programming attempt is stored in a secondary array of programmable fuses, further comprising:
- storing an address identifying a fuse in the primary array or in the secondary array which failed a programming attempt in a tertiary array of programmable fuses; said propagating and correcting steps comprising:
  - propagating the programming states of the fuses in said primary array which were programmed with no failures to an output,
  - correcting the programming state of the fuse which failed a programming attempt located at the address stored in said secondary array, if any; and
  - correcting the programming state of the fuse which failed a programming attempt located at the address stored in said tertiary array, if any.

23. The method of claim 19, further comprising storing an address which does not correspond to any fuse in the primary array if there were no failed fuses.

* * * * *